(12) United States Patent
Kon (10) Patent No.: US 10,685,817 B2
(45) Date of Patent: Jun. 16, 2020

(54) FILM FORMING APPARATUS

(71) Applicant: TOPPAN PRINTING CO., LTD., Tokyo (JP)

(72) Inventor: Masato Kon, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/703,576

(22) Filed: Sep. 13, 2017

(65) Prior Publication Data
US 2018/0005800 A1    Jan. 4, 2018

Related U.S. Application Data (63) Continuation of application No. PCT/JP2016/001388, filed on Mar. 11, 2016.

(30) Foreign Application Priority Data

Mar. 17, 2015   (JP) ................. 2015-053394

(51) Int. Cl.
*H01J 37/34* (2006.01)
*H01J 37/32* (2006.01)
(Continued)

(52) U.S. Cl.
CPC ...... *H01J 37/3277* (2013.01); *C23C 14/0036* (2013.01); *C23C 14/14* (2013.01);
(Continued)

(58) Field of Classification Search
CPC ............ H01J 37/3426; H01J 37/3417; H01J 37/3452; H01J 37/3405; H01J 37/3277;
(Continued)

(56) References Cited

U.S. PATENT DOCUMENTS 4,420,385 A    12/1983  Hartsough
6,186,090 B1 *  2/2001  Dotter, II .............. C23C 14/562
                                                        118/718
(Continued)

FOREIGN PATENT DOCUMENTS

EP    3208363 A1    8/2017
JP    S59-179783 A  10/1984
(Continued)

OTHER PUBLICATIONS

International Search Report issued in International Application No. PCT/JP2016/000138 dated Apr. 12, 2016.
(Continued)

*Primary Examiner* — Michael A Band
(74) *Attorney, Agent, or Firm* — Foley & Lardner LLP (57) ABSTRACT

A film forming apparatus for forming a thin film on a flexible substrate. The film forming apparatus forms a thin film on a flexible substrate under vacuum. The film forming apparatus includes a first zone into which a first gas is introduced and a second zone into which a second gas is introduced in a vacuum chamber. Zone separators have openings through which the flexible substrate passes. The film forming apparatus includes a mechanism that reciprocates the flexible substrate between the zones. Further, the film forming apparatus includes a mechanism that supplies a raw material gas containing metal or silicon to the first zone, and a mechanism that performs sputtering of a material containing metal or silicon as a target material in the second zone.

9 Claims, 3 Drawing Sheets

(51) Int. Cl.
*C23C 16/54* (2006.01)
*C23C 14/56* (2006.01)
*C23C 14/50* (2006.01)
*C23C 14/35* (2006.01)
*C23C 14/34* (2006.01)
*C23C 14/14* (2006.01)
*C23C 14/00* (2006.01)

(52) U.S. Cl.
CPC .......... *C23C 14/3407* (2013.01); *C23C 14/35* (2013.01); *C23C 14/50* (2013.01); *C23C 14/562* (2013.01); *C23C 16/54* (2013.01); *H01J 37/3405* (2013.01); *H01J 37/3417* (2013.01); *H01J 37/3426* (2013.01); *H01J 37/3452* (2013.01); *C23C 14/34* (2013.01)

(58) Field of Classification Search
CPC .... H01J 37/3414; C23C 14/50; C23C 14/562; C23C 14/34; C23C 14/3407; C23C 14/35; C23C 14/0036; C23C 14/14; C23C 14/3464; C23C 14/56; C23C 14/0078; C23C 14/568; C23C 14/352; C23C 16/54
See application file for complete search history.

(56) References Cited

U.S. PATENT DOCUMENTS

| | | |
|---|---|---|
| 2001/0016364 A1 | 8/2001 | Loan et al. |
| 2001/0023971 A1 | 9/2001 | Kondo et al. |
| 2007/0068794 A1 | 3/2007 | Lippey et al. |
| 2007/0224348 A1 | 9/2007 | Dickey et al. |
| 2007/0281089 A1 | 12/2007 | Heller et al. |
| 2009/0272322 A1 | 11/2009 | Fujinami et al. |
| 2009/0291209 A1 | 11/2009 | Granneman et al. |
| 2010/0078312 A1 | 4/2010 | Mullapudi et al. |
| 2010/0140078 A1* | 6/2010 | Pinarbasi ............. C23C 14/042 204/192.1 |
| 2010/0189900 A1 | 7/2010 | Dickey et al. |
| 2010/0264017 A1 | 10/2010 | Nam et al. |
| 2011/0159186 A1* | 6/2011 | Chakchung Yu ............ C23C 16/45548 427/255.5 |
| 2012/0141676 A1 | 6/2012 | Sershen et al. |
| 2012/0171371 A1 | 7/2012 | Dickey et al. |
| 2012/0199469 A1 | 8/2012 | Rasheed et al. |
| 2012/0219708 A1 | 8/2012 | Dickey et al. |
| 2013/0186547 A1 | 7/2013 | Fujino et al. |
| 2014/0326182 A1 | 11/2014 | Wang et al. |
| 2017/0211177 A1 | 7/2017 | Kon |

FOREIGN PATENT DOCUMENTS

| | | |
|---|---|---|
| JP | H07-176481 A | 7/1995 |
| JP | H09-307128 A | 11/1997 |
| JP | H10-110265 A | 4/1998 |
| JP | 2001-073133 | 3/2001 |
| JP | 2006-183145 A | 7/2006 |
| JP | 2007-063639 | 3/2007 |
| JP | 2008-507629 | 3/2008 |
| JP | 2010-242150 A | 10/2010 |
| JP | 2010-255071 A | 11/2010 |
| JP | 2011-504546 A | 2/2011 |
| JP | 2011-096986 A | 5/2011 |
| JP | 2012-012633 A | 1/2012 |
| JP | 2012-077330 | 4/2012 |
| JP | 2013-234365 A | 11/2013 |
| JP | 2014-027191 A | 2/2014 |
| JP | 2014-508222 A | 4/2014 |
| WO | WO-2007/112370 | 10/2007 |

OTHER PUBLICATIONS

Extended European Search Report dated Apr. 17, 2018 in corresponding application No. 15850658.4.
Extended European Search Report dated Feb. 26, 2018 in corresponding application No. 15842589.
International Search Report issued in International Application No. PCT/JP2016/001388 dated Apr. 12, 2016.
Written Opinion issued in International Application No. PCT/JP2016/001388 dated Apr. 12, 2016.
International Search Report issued in International Application No. PCT/JP2015/076527 dated Dec. 22, 2015.
Written Opinion issued in International Application No. PCT/JP2015/076527 dated Dec. 22, 2015.
International Search Report issued in International Application No. PCT/JP2015/005176 dated Jan. 12, 2016.
Written Opinion issued in International Application No. PCT/JP2015/005176 dated Jan. 12, 2016.
Japanese Office Action dated Oct. 23, 2018 in corresponding application No. 2014-210299.
Office Action dated Sep. 12, 2018 in corresponding U.S. Appl. No. 15/457,443.
Extended European Search Report dated Oct. 11, 2018 in corresponding European Application No. 16764465.7, 9 pps.
Japanese Office Action dated Mar. 14, 2019 in corresponding application No. 2015-053394.
Japanese Office Action dated Oct. 1, 2019 for corresponding Application No. 2015-053394.

* cited by examiner

FILM FORMING APPARATUS

CROSS-REFERENCE TO RELATED PATENT APPLICATIONS

This application is a continuation application filed under 35 U.S.C. § 111(a) claiming the benefit under 35 U.S.C. §§ 120 and 365(c) of International Application No. PCT/JP2016/001388, filed on Mar. 11, 2016, which is based upon and claims the benefit of priority of Japanese Patent Application No. 2015-053394, filed on Mar. 17, 2015, the entireties of which are hereby incorporated by reference.

TECHNICAL FIELD

The present invention relates to a film forming apparatus for forming a thin film on a flexible substrate by a vapor deposition method. More specifically, the present invention relates to a vacuum film forming apparatus for forming a thin film by means of gas phase deposition on a flexible substrate, while either continuously or discontinuously transporting the flexible substrate.

BACKGROUND

Methods for forming a thin film by means of gas phase deposition can be broadly divided into chemical vapor deposition (CVD) and physical vapor deposition (PVD).

PVD typically includes vacuum vapor deposition and sputter deposition. In particular, sputter deposition enables production of a high quality thin film with uniform film properties and film thickness, although the apparatus cost is usually high. For this reason, sputter deposition is widely applied to display devices and the like. However, the film may have defects.

CVD is a process of growing a solid thin film by introducing a raw material gas into a vacuum chamber, and decomposing or reacting one type or two or more types of gas on a substrate by means of thermal energy. In some CVD processes, a plasma or catalyst reaction may be used in combination to promote the reaction or decrease reaction temperature. CVD using plasma is called plasma enhanced CVD (PECVD), and CVD using a catalyst reaction is called catalytic CVD (Cat-CVD). Although chemical vapor deposition is characterized by having fewer defects in film formation and is mainly applied to production of semiconductor devices such as film formation of a gate insulation film, it has a disadvantage in that a relatively high temperature is required for film formation.

Atomic layer deposition (ALD), which is classified as CVD, is a film formation process in which a film is formed in a layer-by-layer manner at an atomic level by chemically reacting the substances which are adsorbed on the surface. ALD is distinguished from general CVD in that general CVD uses a single gas or concurrently uses a plurality of gases which are reacted on a substrate to thereby grow a thin film on a substrate, while ALD is a particular film formation method which uses a highly reactive gas, which is referred to as a precursor, and a reactive gas (which is also referred to as a precursor) to perform adsorption on the substrate surface and subsequent chemical reactions to thereby grow a thin film in a layer-by-layer manner at an atomic level.

Specifically, ALD uses a self-limiting effect in surface adsorption that prohibits a certain type of gas from being adsorbed onto a surface after the surface is covered by the gas. Accordingly, after one layer of precursor is adsorbed onto the surface, unreacted precursor is purged. Then, another reactive gas is introduced to oxidize or reduce the above precursor to thereby obtain one layer of a thin film having a desired composition. After that, the reactive gas is purged. This cycle is repeated so as to grow a thin film in a layer-by-layer manner. Accordingly, the thin layers grow in two dimensions in the ALD process. ALD is characterized by reducing deficiencies in film formation compared with typical CVD as well as with conventional vapor deposition or sputtering, and is expected to be applied to various fields.

ALD may include a process of using plasma to enhance the reaction in the step of decomposing a second precursor and reacting the decomposed second precursor with a first precursor adsorbed on the substrate, which is called plasma enhanced ALD (PEALD) or simply plasma ALD.

Since ALD is characterized by having no projection effect or the like compared with other film formation methods, film formation only require a gap through which a gas is introduced. Accordingly, ALD is expected to be applied to fields related to micro electro mechanical systems (MEMS) for covering a three-dimensional structure, as well as for covering lines and holes having a high aspect ratio.

By using the aforementioned film formation method, a thin film is formed on a variety of targets including a small plate-shaped substrate such as a wafer or photomask, a substrate having a large surface area and no flexibility such as a glass plate, or a substrate having a large surface area and flexibility such as a film, and the like. Accordingly, for mass production facilities that form a thin film on these substrates, a variety of handling methods for the substrates which are different in cost, ease of handling, film formation quality, and the like have been proposed and put to practical use.

For example, there are sheet type deposition, batch type deposition, and the like. In sheet type deposition, film formation is performed while one sheet of substrate is supplied on a wafer in a film forming apparatus, and then, film formation is again performed after the sheet is replaced with a subsequent substrate. In batch type deposition, a plurality of substrates are collectively set so that the same film formation is performed onto all the wafers.

Further, methods for forming a film on a glass substrate or the like include an in-line method, in which film formation is concurrently performed while a substrate is successively transported to a portion of a deposition source, and a web coating method using a so-called roll-to-roll method, in which film formation is performed mainly on a flexible substrate while the substrate is paid out from a roll and transported, and then the substrate is taken up by another roll. The web-coating method also includes a transportation/continuous film formation process, in which a substrate on which a film is formed, as well as the flexible substrate, is continuously transported on a flexible sheet or on a partially flexible tray.

An improved combination is adopted from the above film formation methods and the handling methods for the substrates, considering the cost, quality, ease of handling, and the like.

ALD has disadvantages such as use of specific materials, and its cost. Among others, since ALD is a process which grows a thin film at an atomic level by depositing a layer in each cycle, the most significant disadvantage is that the film formation speed is 5 to 10 times slower than other film formation methods such as vapor deposition and sputtering.

To solve the above problem, contrary to the conventional process in which a precursor is repeatedly supplied and discharged in a single chamber (which is called a time-divided type), a space-divided type has been proposed, in which the chamber is divided into several zones so that a single precursor or purge gas is supplied into the respective zones while the substrate is reciprocated among the zones (for example, see PTL 1).

CITATION LIST

Patent Literature

[PTL 1] WO 2007/112370

SUMMARY OF THE INVENTION

Technical Problem

Emergence of the space-divided type ALD process has significantly improved the film formation speed. However, the film formation speed is not still sufficiently improved compared with CVD or sputter deposition, and this contributes to an increase in film formation cost. In roll-to-roll ALD deposition, the film formation speed is determined depending on a transport speed of the flexible material when the ideal conditions such as saturated adsorption being accomplished are met. Further, in order to increase the film thickness, there is a need to increase the area in which the substrate reciprocates at least between two zones, that is, increase the size of apparatus, which also contributes to increase in the cost.

However, a film thickness of a certain extent is required to increase durability of the film produced.

To improve film formation speed, atomic vapor deposition (AVD) has been invented, in which a precursor is introduced in a pulsed manner while a reactive gas is constantly supplied. However, this process is directed to a batch type film forming apparatus of a time-divided type, and is not suitable for use in a roll-to-roll film formation of a time-divided type.

An object of the present invention is to provide a film forming apparatus for forming a thin film on a flexible substrate, wherein the film forming apparatus is capable of reducing the size of the entire apparatus and improving efficiency to thereby enhance productivity.

Solution to Problem

An aspect of the present invention that solves the above problem is a film forming apparatus which forms a thin film on a flexible substrate transported in a vacuum chamber, characterized in that the film forming apparatus comprises: a partition wall that separates the vacuum chamber into at least a first zone and a second zone, the partition wall including an opening through which the flexible substrate passes; a mechanism that reciprocates the flexible substrate between the first zone and the second zone; a mechanism that supplies raw material gas containing metal or silicon into the first zone; and a mechanism that is disposed in the second zone and performs sputtering of a material containing metal or silicon as a target material.

Advantageous Effects of the Invention

According to the present invention, the following effects can be obtained.

That is, a film of higher quality than that obtained by sputter film formation can be obtained at a high film formation speed by using the above apparatus. Moreover, as a result of that, the apparatus can be reduced in size.

Further, compared with the case where only sputter film formation is performed, film formation defects specific to sputter film formation contained in the film can be reduced.

DESCRIPTION OF REPRESENTATIVE EMBODIMENTS

With reference to the drawings, embodiments of the present invention will be described in detail. It will be understood that the embodiments described below are representative of the present invention, and that the present invention is not necessarily limited to the described embodiments.

Figure 1:
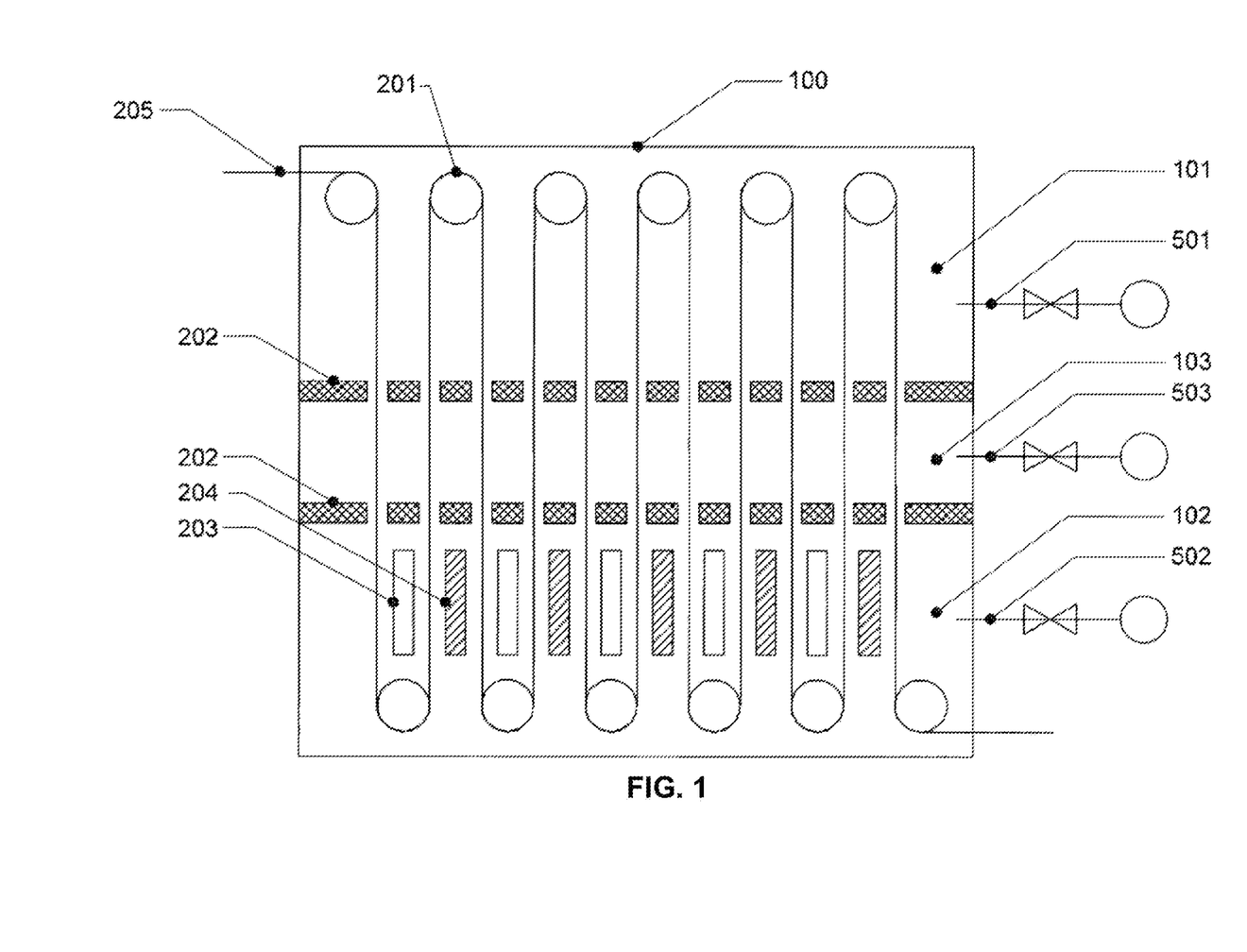
FIG. 1 is an exemplary configuration diagram of a vacuum chamber for illustrating a film forming apparatus according to an embodiment of the present invention. The diagram schematically illustrates only a film formation section, which is a core of the apparatus.

FIG. 1 illustrates only a portion of a vacuum chamber 100 which performs film formation. Although film formation on a flexible substrate 205 is typically performed by a roll-to-roll method as described above, the method is not limited thereto. In the drawing, a film supplying unit uses a known technique and illustration thereof is omitted.

<Configuration>

The vacuum chamber 100 is separated into at least two zones by a zone separator 202. As shown in FIG. 1, the vacuum chamber 100 of the present embodiment is separated into three zones 101, 102 and 103 by two zone separators 202 positioned with a predetermined space in a transportation direction of the substrate 205. That is, the present embodiment shows an example in which the third zone 103 is disposed between the first zone 101 and the second zone 102. A plurality of third zones 103 may be provided.

The flexible substrate 205, which is fed into the vacuum chamber 100, is transported by a plurality of rollers 201 to reciprocate between the first zone 101 and the second zone 102 a plurality of times by changing the transportation direction by 180 degrees, and then fed out from the vacuum chamber 100. The zone separators 202 constitute partition walls. The plurality of rollers 201 constitutes a mechanism that reciprocates the substrate 205 between the first zone 101 and the second zone 102.

A raw material gas is introduced into the first zone 101 by a raw material gas introduction mechanism 501. The raw material gas mainly contains metal or silicon.

The second zone 102 is provided with electrodes 203, and a target material corresponding to the target film type for film formation is set as the electrode 203. The electrodes 203 are positioned to face a sputtering surface of the substrate 205 which is transported. When a plurality of electrodes 203 are provided, all the electrodes 203 may have the same material and composition ratio. Alternatively, only one or some of the electrodes 203 or each of the electrodes 203 may have different material and composition ratio. FIG. 1 shows an example in which electrodes 204 as well as the electrodes 203 are provided as electrodes and disposed to face the sputtering surface. Using the electrodes 203 in addition to the electrodes 204 enables film formation on both surfaces of the flexible substrate 205. Using different materials for the electrode 203 and 204 enables formation of films of different materials on both surfaces of the flexible substrate 205.

A gas suitable for sputtering is introduced into the second zone 102 by a sputtering gas introduction mechanism 502. When reactive sputtering is performed, a reactive gas is also introduced. In addition, reactive sputtering also includes a case where a lower oxide target having oxygen vacancy type conductivity is used instead of a metal target, and a reactive gas is further introduced to form an oxide thin film. For example, indium tin oxide having an oxygen content lower than the stoichiometric composition ratio is used for the target material, and argon and oxygen are used for the gas to form an oxide thin film. In the present invention, such a case is also included in the reactive sputtering.

When the main component of the metal or silicon mainly contained in the raw material gas is the same as the main component of the metal or silicon mainly contained in the target, a thin film of the same (a single) species can be formed. On the other hand, when they are different from each other, a thin film of a plurality of components can be formed. Of the components which constitute the film, when the components of sputter film formation accounts for a large portion and the components of the raw material gas adsorbed in the first zone 101 accounts for a small portion, the components of the raw material gas may also be used as a doping material for the sputter film.

The electrodes 203 and 204 serve as the electrodes for exciting plasma in sputter film formation. Detailed configuration and features of the electrodes 203 and 204 will be described later.

The zone separators 202 include openings through which the flexible substrate 205 passes. The size of the opening is preferably minimized within the range in which the substrate 205 is not in contact with the wall of the opening during transportation of the flexible substrate 205. If the opening is large, the zone separator 202 fails to perform its role sufficiently. That is, the gas present in the zone of concern is mixed with the gas present in the adjacent zone. When the amount of such gas increases to an extent which affects the film being deposited, problems that cannot be ignored such as a failure in achieving the expected film quality occur. Therefore, the opening is required to be small within the possible range.

In order to alleviate the effect described above, the third zone 103 according to the present embodiment is provided as a buffer between the first zone 101 and the second zone 102 as shown in FIG. 1. Further, a mechanism 503 that introduces an inert gas into the third zone 103 is provided. Accordingly, an inert gas is introduced into the third zone 103 during film formation, which can reduce direct mixture of the gas introduced into the first zone 101 and the gas introduced into the second zone 102. It is more effective to produce a flow of the inert gas introduced in the third zone 103 to be exhausted through the first zone 101 and/or the second zone 102.

Film formation is performed by reciprocating the flexible substrate 205 between the first zone 101 and the second zone 102 via the third zone 103 through the openings of the zone separator 202.

FIGS. 2A-2I are schematic cross-sectional views of configurations of the electrode 203 or 204. The electrode 203 or 204 constitutes a mechanism that performs sputtering.

The electrodes 203 and 204 are essentially the same except for that they are disposed at different positions in the chamber 100, although considerations may be required for positioning of left or right orientation depending on practical applications. Of course, the electrodes 203 and 204 may be different from each other. When film formation is performed on one surface of the flexible substrate 205, either one of the groups of the electrodes is used. However, when film formation is performed on both surfaces of the flexible substrate 205, both groups are provided and used at the same time. In the following description, the electrode 203 and the electrode 204 can be replaced with each other unless otherwise specifically provided, and the electrode 203 will be described in the following description of the configuration.

Figure 2:
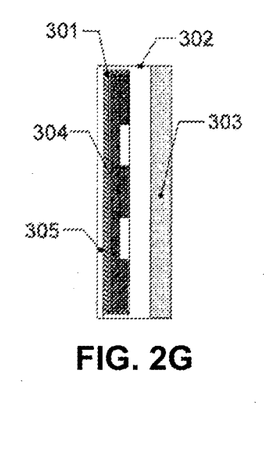
FIGS. 2A-2I are schematic diagrams of an electrode of the film forming apparatus according to an embodiment of the present invention.
Figure 2A:
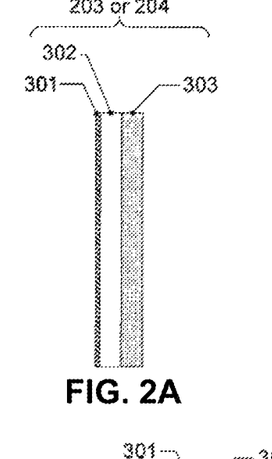

Typically, a sputtering target serves as an electrode during plasma excitation. A typical example is a copper plate (which is called a backing plate) with high conductivity on which a target material that serves as a raw material during sputter film formation is formed. FIG. 2A illustrates an example in which a target material 303 is disposed on one surface of a backing plate 302. In general sputter film formation, a rear surface of the target is not exposed to vacuum. On the other hand, the electrode 203 used in the present embodiment is mainly disposed between the flexible substrates 205. Accordingly, an insulator 301 is disposed on one surface of the electrode 203 to prevent electrical discharge from the backing plate 302, unless sputtering is performed on both surfaces.

Figure 2B:
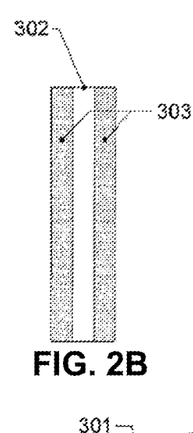

When sputtering is performed on both surfaces, the target materials 303 are disposed on both surfaces of the backing plate 302 as shown in FIG. 2B. Here, the target materials 303 may be made of the same material or materials different from each other. When using different materials, sputter films having composition containing each of the materials instead of a single material can be formed. A material containing metal or silicon is used for the target material 303 to ensure conductivity required for sputter film formation. Oxide or nitride may also be used as long as conductivity can be ensured. For example, as previously described, indium tin oxide (ITO) or the like can also be used as a conductive target material when it is produced with appropriate control of the components and degree of oxidation. When the conductivity of the target material is insufficient or when the conductivity decreases during film formation, a known pulsed DC power supply or dual cathode technology can be used to prevent interruption of electric discharge. When a non-conductive target material is used, an RF power supply may be preferably used. However, in this case, there is a certain limitation such as that all the electrodes need to be in phase for stabilization of electric discharge.

Figure 2C:
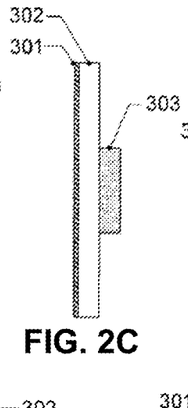

FIG. 2C illustrates the same configuration as that of FIG. 2A except for the target material 303 disposed on part of the backing plate 302. Using this configuration enables a selective situation in which the sputter film formation is mainly performed on a portion of the flexible substrate 205 which faces the target material 303, and modification/activation of the surface of the substrate 205 by the excited plasma is performed on the remaining portion. Accordingly, this is advantageous when film formation and modification/activation are desired to be performed not at the same time but at slightly different timings. However, in order to prevent the components of the backing plate 302 from being sputtered, it is necessary to use a material of low sputtering rate for the backing plate 302.

Figure 2D:
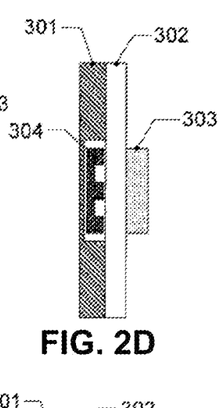

FIG. 2D illustrates a configuration for alleviating such a limitation, in which a magnetron is provided on the rear surface corresponding to only a portion on which the target material 303 is disposed. This enables a high plasma density only in a region adjacent to the target material 303. Accordingly, an electric power applied can be reduced, and the amount of the backing plate 302 being sputtered can be relatively reduced.

Figure 2E:
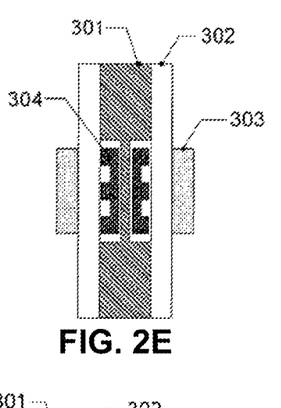

FIG. 2E illustrates an example in which two magnetrons 304 are positioned back to back so that sputtering on both surfaces can be performed. In order to prevent interference between the two magnetrons 304, a magnetic shield sheet (not shown in the figure) may be provided therebetween. Details of the magnetic shield sheet will be described later.

Figure 2F:
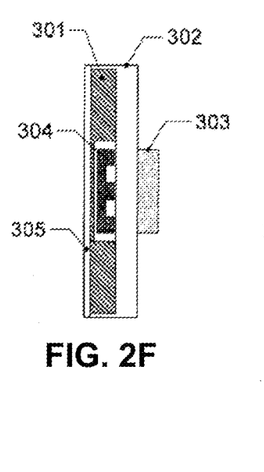

FIG. 2F illustrates an example in which the target material 303 is provided on one surface of the backing plate 302, the magnetron 304 is provided on the rear surface of the backing plate 302 and is protected by the insulator 301 disposed on the magnetron 304, and a conductor 305 is provided on the insulator 301 so that the target material 303 or the backing plate 302 is electrically connected to the conductor 305. The conductor may be made of any material. Further, electrical connection may be established in any manner. As a result, sputter film formation is performed on the surface having the target material 303, and surface modification of the film during growth on the flexible substrate 205 can be performed on the surface having the conductor 305. While FIG. 2F illustrates that the target material 303 is formed on a portion of the backing plate 302, the target material 303 may also be entirely formed on one surface of the backing plate 302 as illustrated in FIG. 2G. The size of the magnetron 304 is also modified as appropriate depending on the size of the target material 303.

Figure 2H:
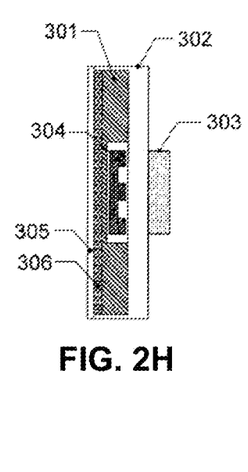

FIG. 2H illustrates an example in which a magnetic shield sheet 306 is provided between the magnetron 304 and the conductor 305 of the electrode shown in FIG. 2F. The type and material of the magnetic shield sheet are not specifically limited as long as a sufficient magnetic shield effect can be performed. A known magnetic shield sheet may be applied when it prevents leakage of the magnetic field from the magnetron 304 and minimizes sputtering from the conductor 305.

Although not shown in the figure, an electrode may also be provided with a water-cooling or other cooling mechanism to prevent accumulation of excessive heat on the electrode. The heat of the electrode is transmitted to the flexible substrate 205 as radiated heat, which may cause damage to the flexible substrate 205. Accordingly, it is preferred to prevent such heat.

<Film Formation Method>

Next, a film formation method using the above film forming apparatus will be described. Film formation is performed in the following manner by using the present film forming apparatus.

The effects due to different electrodes have been already described above. In addition, since the film forming method is the same, the following description will be made with reference to FIG. 3 by means of an example of FIG. 2I in which the target material 303 of the FIG. 2H is formed on the entire surface of the backing plate 302.

Figure 2I:
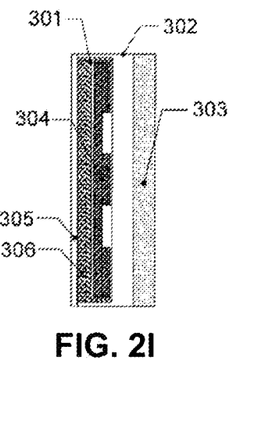

The target material 303 is a conductive material as described above. It is one of the features of the present invention that a material that is difficult to use in film formation which uses raw material gas can be selected as a target material in sputter film formation. That is, in CVD or ALD, high melting point metals and compounds thereof generally require high temperature when they are taken out as a raw material gas, and also require high temperature during film formation. Accordingly, film formation onto the flexible substrate 205 is difficult. However, in sputter film formation, these materials can also be used as a target material. Therefore, a variety of materials can be used in this film formation.

Figure 3:
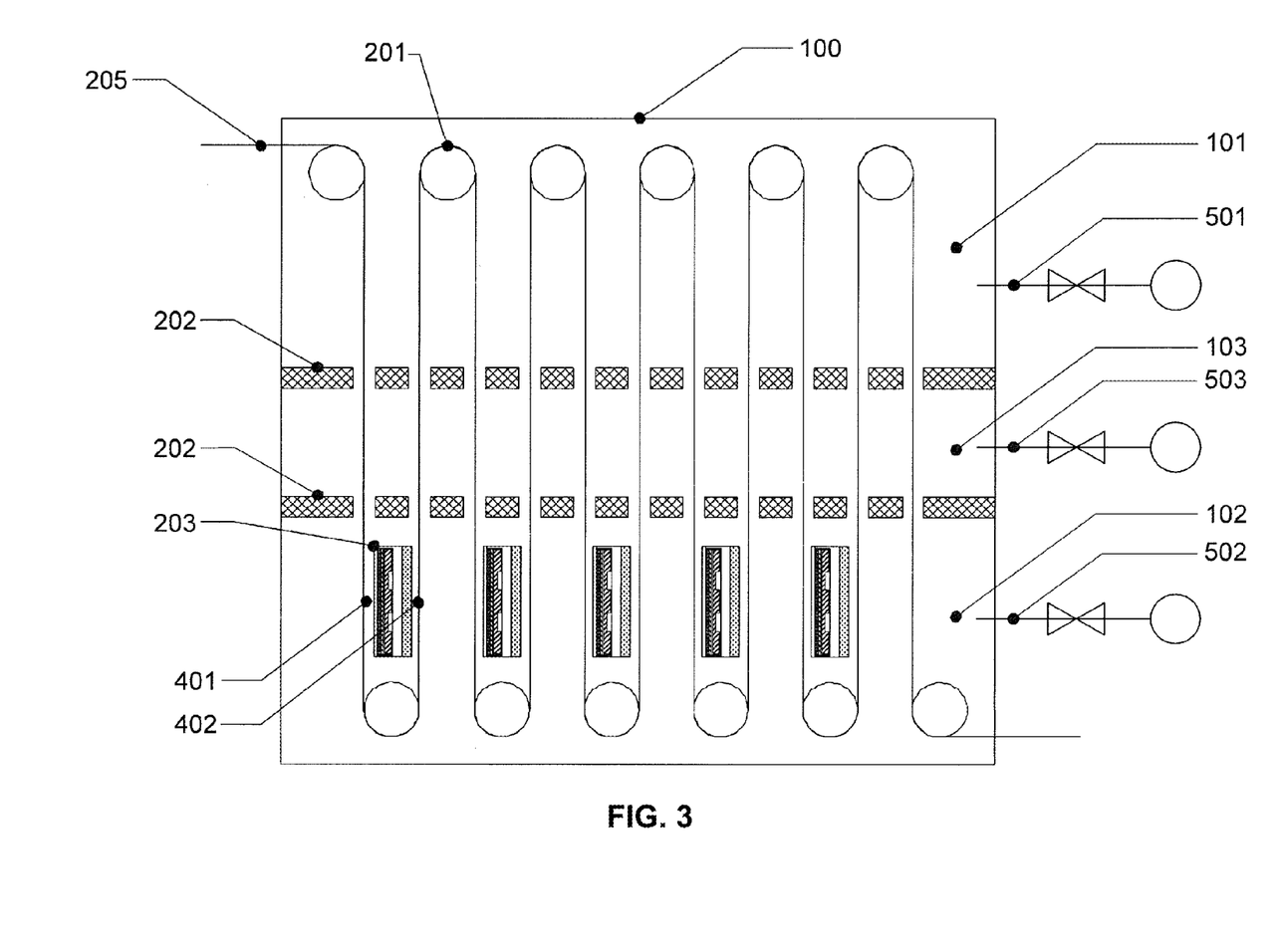
FIG. 3 is a schematic diagram of an example which illustrates a film formation method of the film forming apparatus according to an embodiment of the present invention.

In the exemplary configuration shown in the figure, the electrodes 203 are all the same. However, each of the electrodes may be appropriately selected or eliminated depending on the desired film. That is, in the above description, the electrodes 203 or 204 which constitute the sputtering film forming apparatus are configured to perform sputtering each time the substrate 205 moves from the first zone 101 to the second zone 102. However, the electrodes 203 or 204 may be disposed at least one position in the second zone 102. Further, the positions or the number of the electrodes 203 or 204 is determined considering mutual effects between the film quality and film formation speed.

In the film formation method according to the present film forming apparatus, the flexible substrate 205 is first set in the vacuum chamber 100 in the film forming apparatus, and the chamber 100 is evacuated. Since the required degree of vacuum varies depending on the film quality to be produced or allowable processing speed, it should be set according to requirements. The material for the flexible substrate 205 may be PET, PEN, polyimide or the like, or any other material including a foil, paper, and cloth that can bear the transport of the substrate 205 in the present apparatus configuration. The material may also be silicon or glass which is thinned and bendable. Alternatively, the material may be a composite material containing a plurality of the above materials.

If necessary, the vacuum chamber 100 is heated as appropriate.

Subsequently, a raw material gas containing metal or silicon is introduced into the first zone 101, and argon gas is introduced into the second zone 102. In the case where reactive sputtering is performed in the second zone 102, a reactive gas such as oxygen is also introduced. During this operation, cleaning of the target surface by pre-sputtering is also performed.

Further, an inert argon or nitrogen gas may be introduced as a purge gas into the third zone 103. Here, a gas pressure of the third zone 103 may be preferably set to be the highest among those of the other zones. Accordingly, the probability or percentage of mixture of the precursor introduced into the first zone 101 and the gas for sputtering introduced into the second zone 102 can be reduced. However, this does not apply to a case where a component inactive to the raw material gas introduced into the first zone 101 is selected as the gas for sputtering.

Then, sputter film formation is performed along with the start of transportation of the flexible substrate 205. Although general DC sputtering can be used, radio frequency waves, microwaves, an inductively coupled plasma (ICP), and the like can also be used as a plasma excitation source depending on the number of cathodes (targets). Known techniques may also be applied to prevent arcing. Examples of these techniques include use of a pulsed DC power supply and use of a DC power supply with an arc-cut control circuit.

The power applied to plasma during sputter film formation can be freely set depending on a desired film quality and film deposition speed. In sputter film formation, the film thickness of the produced film generally increases in proportion to discharge power. Since the feature of this film formation method is that adsorption of the raw material gas and sputter film formation are repeated in a complementary and alternative manner, the advantages of this film formation method may be impaired if the sputter film formation is intensively performed.

Here, focusing on the flexible substrate 205 which is transported, the flexible substrate 205 introduced into a film formation chamber of the vacuum chamber 100 is exposed to gas containing metal or silicon in the first zone 101. In this example, suppose that the flexible substrate 205 enters the vacuum chamber 100 from the upper left in FIG. 3. The raw material gas is adsorbed onto the surface of the flexible substrate 205. Then, the flexible substrate 205 moves to the third zone 103 through the opening of the zone separator 202, and is exposed to an inert gas. The raw material gas which has been adsorbed in the first zone 101 still remains on the surface of the flexible substrate 205. Then, the flexible substrate 205 moves again through the opening of the zone separator 202 to the second zone 102, and is exposed to the gas for sputter film formation.

In the example of FIG. 3, the electrodes are housed at the orientation as shown in FIG. 2I. That is, in the region adjacent to the space 401, plasma is excited by electric discharge from the electrode 203. Accordingly, the raw material gas adsorbed on the surface of the flexible substrate 205 located adjacent to the space 401 is modified. How it is modified varies depending on the elements that are present adjacent to the surface. For example, when oxygen is present as an element, oxidation is expected. Subsequently, the flexible substrate 205 is turned by the roller 201 by 180 degrees, and is again guided to the front of the electrode 203. Here, as viewed from the flexible substrate 205, the electrode 203 has the target material 303 on the surface thereof, and components of the target material 303 are sputtered. Accordingly, sputter film formation proceeds onto the flexible substrate 205 adjacent to the space 402. Then, the flexible substrate 205 enters the third zone 103 through the opening of the zone separator 202, and subsequently enters the first zone 101 again. A sequence of film formation proceeds by repeating the above processes.

Although showing the numerical values is not appropriate since there may be a variety of possibilities, it is advantageous to adjust the applied electric power of the sputter film formation so that a film of the order of 0.2 to 1 nm is formed by sputter film formation each time the flexible substrate 205 pass through the region adjacent to the space 402. This increases the film growth speed while preventing a decrease in film quality.

The flexible substrate 205 reciprocates between the first zone 101 and the second zone 102 until a desired film thickness is achieved. For ease of description, only five times of reciprocation is illustrated in FIG. 3. However, the number of reciprocation is determined by the number of turns of the flexible substrate 205. Accordingly, the apparatus used is designed in advance considering the number of turns (that is, the number of rollers 201 and the number of electrodes 203) for the desired film thickness. In general, a film thickness of 10 to 50 nm is thought to be necessary, and the number of turns may be determined on the basis of such a film thickness.

Since the transport speed of the substrate 205 is limited by the throughput required and permitted by the film quality, it is not advantageous to specify the speed.

After the film formation is performed until the desired film thickness is obtained, the plasma is turned off, supply of gases including the raw material gas is stopped, and the vacuum chamber 100 is evacuated to completely discharge the gas remaining in the chamber. After that, the vacuum chamber 100 is vented and the flexible substrate 205 is removed. In a case where the flexible substrate 205 is paid out and taken up in a roll-to-roll manner by a separate chamber, the separate chamber is vented and the roll on which the film is formed is removed.

Thus, the film formation is completed.

Effects of the Present Embodiment

By using the film forming apparatus of the present embodiment, the raw material gas containing metal or silicon covers the entire surface of the flexible substrate in a three dimensional manner including holes and pits present on the flexible substrate 205 in the step of transferring the flexible substrate 205 through the first zone 101. In the subsequent step of transferring the flexible substrate 205 through the second zone 102, a thin film containing components which constitute the sputtering target is formed by sputter film formation. Accordingly, deposition for a film thickness from a few atomic layers to a few tens or a few hundreds of atomic layers is expected depending on the sputter film formation conditions. By repeating these steps, a thin film of one atomic layer level (ALD film) is obtained in the first zone 101, and a thick film by the sputter film formation (sputtering film) is obtained in the second zone 102.

Although the sputter film formation is a process having many defects, the raw material gas in the first zone 101 covers the defects, if any, to thereby form a generally good thin film. The above may be applied to film formation of an isolation film, dielectric film, gas barrier film and the like.

That is, in ALD, a film is formed in layer (atomic layer) units, and the adsorption of precursors varies depending on the state or foreign matter (contamination) on the target substrate. Accordingly, there is a problem that atomic layers are not sequentially formed on the substrate in an ideal manner. On the other hand, although sputtering method cannot perform elaborate film formation in atomic layer units, sputtering film formation is relatively easy compared to ALD.

In the present embodiment, combination of precursor adsorption (adsorption by ALD) in the first zone 101 and the subsequent sputtering film formation in the second zone 102 allows for a mutually complementary relationship. Specifically, there are effects that a gap in the sputtering film is filled by an ALD film, and further, precursors can be well adsorbed onto the sputtering film, which facilitates formation of ALD film.

Moreover, since the surface of the substrate made of a polymer material has irregularities or cavities of the polymeric structure surface (the surface is not uniform when viewed by an electron microscope), there is also an effect that a difficulty in forming an ALS film in the initial stage of film formation can be solved. In this embodiment, another effect is expected that brittleness of the ALD film is covered, including the hardness of the sputtering film, although the barrier properties may not be the same as that of a completely elaborately formed ALD film.

In addition, by providing the third zone 103 and adopting a configuration in which an inert gas is introduced into the third zone 103, it is possible to prevent gas mixing between the first zone 101 and the second zone 102 and reduce unintended film deposition onto the flexible substrate 205. Further, film deposition onto the inner wall of the chamber 100 can also be prevented in the first zone 101 and the third zone 103.

Moreover, the target material is disposed on part of the electrode 203.

With this configuration, after the gas containing metal or silicon adsorbed onto the flexible substrate 205 is efficiently decomposed or reacted in the first zone 101, the film formed by sputtering can be laminated on a portion of the surface of the electrode 203 which is not covered by the target material.

In addition, a magnetron is disposed on the electrode 203 corresponding to a portion where the target material is disposed.

Combining a sputtering target (electrode 203) with a magnetron itself is a known technique. On the other hand, the present embodiment combines a magnetron with a portion of the surface of the electrode 203 which is covered by the target material, and does not provide a magnetron on a portion which is not covered by the target material.

With this configuration, a selective situation can be provided in which, depending on the applied electric power, the amount of particles sputtered from the target material can be drastically increased (increase in sputter ratio) in a portion combined with a magnetron, while little sputtering is performed in the remaining portion.

Further, the target material is formed only on one of two surfaces of the electrode 203 that face the flexible substrate 205.

With this configuration, one of the surfaces can perform sputter film formation onto the flexible substrate 205, while the other of the surfaces can perform surface modification of the thin film formed on the flexible substrate 205 or the thin film during growth.

Further, in the electrode 203 in which a target material is disposed only on one of two surfaces of the electrode 203 which faces the flexible substrate 205, a magnetron is disposed on the other of the surfaces of the electrode 203, and a conductor is formed to cover the magnetron so that the target material and the conductor are electrically connected to each other.

With this configuration, one of the surfaces can perform magnetron sputtering, while the other of the surfaces can perform surface modification of the thin film formed on the flexible substrate 205 or the thin film during growth.

Further, a magnetic shielding structure is provided between the magnetron and the conductor.

With this configuration, effect of the magnetic field acting on the conductor located opposite to the target material can be eliminated or reduced. Accordingly, sputtering onto the conductor surface can be prevented.

Further, when the sputtering is reactive sputtering, a thin film can be formed by efficiently modifying the raw material gas adsorbed on the flexible substrate 205 by means of an active species derived by plasma from a reactive gas.

Although the description has been given with reference to a limited number of embodiments, the scope of the invention is not limited thereto, and modifications of the above embodiments on the basis of the above disclosure are obvious to a person having ordinary skill in the art. That is, the present invention may not be limited to the aforementioned embodiments. Design modifications or the like can also be made to the above embodiments on the basis of the knowledge of a person skilled in the art, and such modifications or the like are encompassed within the scope of the present invention.

INDUSTRIAL APPLICABILITY

The present invention can perform film formation without increasing the cost of facilities in the process of forming a film on the substrate while transporting the substrate, which contributes to reduction in production cost. Moreover, a variety of films can be produced.

REFERENCE SIGNS LIST 100 vacuum chamber
101 first zone
102 second zone
103 third zone
201 roller
202 zone separator
203, 204 electrode
205 flexible substrate
301 insulator
302 backing plate
303 target material
304 magnetron
305 conductor
306 magnetic shield sheet
401, 402 space
501, 502, 503 mechanism for introducing gas

What is claimed is:

1. A film forming apparatus that forms a thin film on a flexible substrate transported in a vacuum chamber, the film forming apparatus comprising:

the vacuum chamber comprises a first zone, a second zone and a third zone provided between the first zone and the second zone, the first zone and the third zone are separated by a first partition wall, the second zone and the third zone are separated by a second partition wall, each of the first and the second partition walls includes a plurality of openings through which the flexible substrate passes;

a mechanism that reciprocates the flexible substrate between the first zone and the second zone so that the flexible substrate passes through each of the openings in the first and the second partition walls, while passing through each of the first zone and the second zone multiple times; and a mechanism that supplies raw material gas containing metal or silicon into the first zone;

wherein the second zone comprises sputtering targets, wherein all of the sputtering targets belong to either a first plurality of sputtering targets or to a second plurality of sputtering targets, wherein the mechanism that reciprocates the flexible substrate between the first zone and the second zone comprises a first plurality of rollers in the first zone and a second plurality of rollers in the second zone so that the flexible substrate is turned by 180° at each roller of the first plurality and the second plurality, the flexible substrate includes a plurality of curved portions around rollers of the first plurality and the second plurality and a plurality of linear portions, each of which extends from a roller of the first plurality to a roller of the second plurality or from a roller of the second plurality to a roller of the first plurality, wherein the linear portions are parallel to each other, wherein each sputtering target of the first plurality of sputtering targets and the second plurality of sputtering targets comprises a target material containing metal or silicon, wherein a sputtering target of the first plurality of sputtering targets differs from a sputtering target of the second plurality of sputtering targets in a material or a composition ratio, wherein the flexible substrate comprises a first surface and a second surface, which is opposite to the first surface, wherein each of the sputtering targets of the first plurality of sputtering targets and the second plurality of sputtering targets is positioned between a linear portion of said plurality of linear portions, which extends from a roller of the first plurality to a roller of the second plurality, and a linear portion of said plurality of linear portions, which extends from a roller of the second plurality to a roller of the first plurality, wherein all sputtering targets of the first plurality of sputtering targets and the second plurality of sputtering targets are aligned to extend both parallel to each other and parallel to all linear portions of said plurality of linear portions so that all sputtering targets have the same position relative to the second partition wall.

2. The film forming apparatus of claim 1, further comprising:
a mechanism that introduces an inert gas into the third zone.

3. The film forming apparatus of claim 1, wherein:
each sputtering target of the first plurality comprises an electrode, and,
the target material is disposed only on a portion of the electrode.

4. The film forming apparatus of claim 3,
wherein each sputtering target of the first plurality further comprises a magnetron provided on a rear surface of the electrode wherein the magnetron is provided only in an area of the rear surface corresponding to the portion of the electrode on which the target material is disposed.

5. The film forming apparatus of claim 4,
wherein the target material is disposed only on one of two opposite surfaces of the electrode.

6. The film forming apparatus of claim 5,
wherein the film forming apparatus has a configuration in which the target material is disposed only on a first surface of the two opposite surfaces of the electrode, the first surface faces the flexible substrate, and the magnetron is disposed on a surface of the two surfaces of the electrode, which is opposite to the first surface, wherein the film forming apparatus
further comprises a conductor that is formed to cover the magnetron,
the target material and the conductor being electrically connected to each other.

7. The film forming apparatus of claim 6, further comprising a magnetic shielding structure provided between the magnetron and the conductor.

8. The film forming apparatus of claim 1, wherein the sputtering is reactive sputtering.

9. The film formation apparatus of claim 2, wherein a gas pressure in the third zone is higher than a pressure in the first zone or a pressure in the second zone.

* * * * *